United States Patent
Yiu et al.

(10) Patent No.: US 6,693,317 B2
(45) Date of Patent: Feb. 17, 2004

(54) OPTICAL SENSOR BY USING TUNNELING DIODE

(75) Inventors: Ho-Yin Yiu, Hong Kong (TW); Chein-Ling Jan, Hsin-Chu (TW); Jen-Pan Wang, Tainan (TW); Lin-June Wu, Hsin-Chu (TW)

(73) Assignee: Taiwan Semiconductor Manufacturing Company, Hsin-chu (TW)

( * ) Notice: Subject to any disclaimer, the term of this patent is extended or adjusted under 35 U.S.C. 154(b) by 0 days.

(21) Appl. No.: 10/437,147

(22) Filed: May 13, 2003

(65) Prior Publication Data

US 2003/0203525 A1 Oct. 30, 2003

Related U.S. Application Data

(62) Division of application No. 09/904,138, filed on Jul. 13, 2001, now Pat. No. 6,582,981.

(51) Int. Cl.⁷ .................. H01L 29/76; H01L 29/792
(52) U.S. Cl. .................. 257/302; 257/315; 257/321; 257/326
(58) Field of Search ................ 257/356, 393, 257/357, 358, 411, 51, 302, 315, 321, 326; 438/710, 709, 526, 294, 295, 404, 492, 494, 495, 504, 506, 507

(56) References Cited

U.S. PATENT DOCUMENTS

| | | | | |
|---|---|---|---|---|
| 4,412,900 A | * | 11/1983 | Tanaka et al. | 204/192.26 |
| 4,683,642 A | * | 8/1987 | Calviello | 438/570 |
| 4,692,997 A | * | 9/1987 | Calviello | 29/25.02 |
| 4,766,471 A | * | 8/1988 | Ovshinsky et al. | 257/53 |
| 4,876,220 A | * | 10/1989 | Mohsen et al. | 438/200 |
| 4,965,212 A | | 10/1990 | Aktik | 437/4 |
| 5,114,866 A | | 5/1992 | Ito et al. | 437/3 |
| 5,225,369 A | * | 7/1993 | Su et al. | 438/93 |
| 5,260,225 A | | 11/1993 | Liu et al. | 437/3 |
| 5,589,696 A | * | 12/1996 | Baba | 257/105 |
| 5,686,739 A | * | 11/1997 | Baba | 257/105 |
| 5,739,065 A | * | 4/1998 | Lin | 438/592 |
| 5,744,850 A | * | 4/1998 | Sato et al. | 257/438 |
| 5,789,263 A | * | 8/1998 | Kuo et al. | 438/57 |
| 5,844,292 A | | 12/1998 | Thierry | 257/458 |
| 5,920,091 A | * | 7/1999 | Lin | 257/290 |
| 5,976,926 A | * | 11/1999 | Wu et al. | 438/237 |
| 6,239,450 B1 | * | 5/2001 | Harvey et al. | 257/49 |

OTHER PUBLICATIONS

Ng, Kwok K., "Complete Guide to Semiconductor Devices", McGraw Hill, Inc., New York, NY (1995), pp. 140–142.

* cited by examiner

Primary Examiner—Michael S. Lebentritt
(74) Attorney, Agent, or Firm—George O. Saile; Stephen B. Ackerman

(57) ABSTRACT

A method of fabricating a tunneling photodiode is presented comprised of the following steps: forming a p-well in an n-type substrate, forming a thin insulating layer over the surface of the p-type material, and then forming a thin n-type layer over the insulating layer. Preferably, the n and p type semiconductor material could be silicon and the insulating layer could be between about 30 to 40 angstroms of gate quality silicon dioxide. In other embodiments of the invention the materials of either electrode are either n or p-type semiconductors or metals.

4 Claims, 3 Drawing Sheets

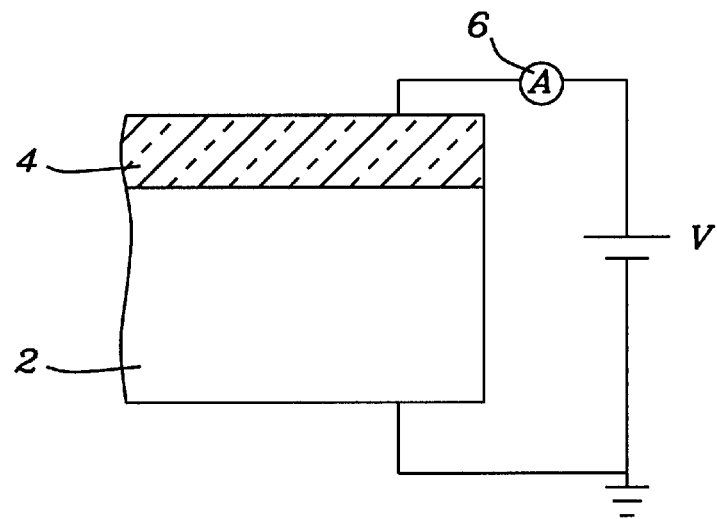
FIG. 1 – Prior Art
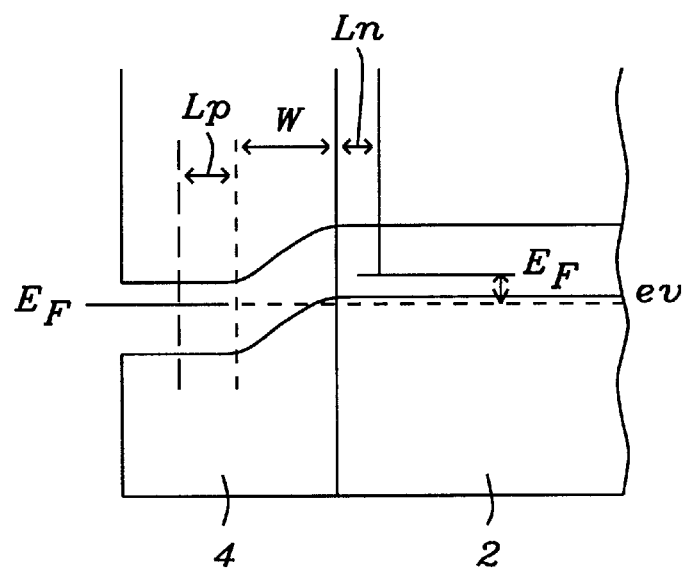
FIG. 2 – Prior Art

OPTICAL SENSOR BY USING TUNNELING DIODE

This is a division of patent application Ser. No. 09/904,138, filing date Jul. 13, 2001, now U.S. Pat. No. 6,582,981 Novel Optical Sensor By Using Tunneling Diode, assigned to the same assignee as the present invention.

BACKGROUND OF THE INVENTION (1) Field of the Invention

The present invention relates generally to photosensitive devises and more particularly to an optical sensor having very low dark leakage current.

(2) Description of Prior Art

Optical sensors are utilized extensively in modern technology. Ng, Kwok K., Comple Guide to Semiconductor Devices, McGraw Hill, Inc., pp. 140–142, discusses buried-channel charge-coupled and peristaltic charge-coupled optical devices. Traditionally, photosensitive devises are semiconductor diodes in which the light induced signal is related to the passage of photon-generated electrons and holes through the electric field region of the diode. To maintain low dark currents the diodes are reverse biased. The electrical field acts on thermally generated electrons and holes in the same way as on those that are photon-generated. Usually, light induced signals dominate those in the dark when the electron-hole generation rate due to photons dominates the thermal electron-hole generation rate. At low light intensities the differences could be small and errors could result.

A junction photo-diode, shown in FIG. 1 Prior Art, is a typical conventional optical sensor. Region 2 is a p-type semiconductor and region 4 is a thin n+ layer of the same semiconductor. As shown in FIG. 1 Prior Art, a reverse bias, V, is applied and an ammeter, 6, measures the current. The energy band diagram of the biased junction photo-diode is shown in FIG. 2 Prior Art. The electric field is essentially confined to a depletion region of width, w, in the vicinity of the p-n junction, as shown in FIG. 2 Prior Art. When the doping density on one side of the junction is much larger than on the other, the depletion region will predominately be on that side. The depletion width increases as the reverse bias increases. When light is incident on the surface of the n+ region, 4, and if the photon energy is sufficiently high electron-hole pairs are generated at a rate proportional to the light intensity. For those pairs generated within the depletion region, the electrons are swept to the n+ neutral region and the holes to the p neutral region. Electrons generated in the neutral p region could diffuse to the depletion region and be swept to the n+ neutral region. Effectively, this adds a width Ln, the electron diffusion length in the p region, to w as the total width where electrons are swept by the field to the neutral n+ region. Similarly, w+Lp, where Lp is the hole diffusion length, is the width where holes are swept by the field to the neutral p region. The photocurrent is thus proportional to w+Ln+Lp times the photon induced pair generation rate. In the absence of light the current is essentially proportional to w+Ln+Lp times the thermal generation rate. Thus at low light intensities the photocurrent need not dominate the dark current.

It is important that light penetrate to the vicinity of the depletion region so that significant pair generation occurs where the created electrons and holes can be acted on by the field and thus contribute to the current. Therefor the n+ region, 4, must be thin enough to allow for this penetration. A junction photodiode can also have a thin p region disposed over an n region, with the light incident on the p region.

U.S. Pat. No. 4,965,212 to Aktik shows a junction photodiode comprised of a thin p+ type hydrogenated amorphous silicon layer disposed on a layer of n-type hydrogenated amorphous silicon. Also shown is a photosensitive diode where the p+ type layer is replaced by a thin metallic layer. Another photosensitive devise utilizing hydrogenated amorphous silicon is described in U.S. Pat. No. 5,844,292 to Thierry. There the devise is a p-i-n diode with the p-type, intrinsic and n-type layers being composed of hydrogenated amorphous silicon. A p-i-n photodiode operates similar to a p-n junction photodiode, the intrinsic layer of the p-i-n diode acts in the same way as the depletion region of the p-n diode.

U.S. patent to Ito et al. shows an avalanche photodiode in which an additional doped region is added to prevent edge breakdown. An avalanche photodiode is essentially a junction photodiode operated at high reverse bias where avalanche multiplication takes place. To obtain spatially uniform multiplication, edge breakdown must be eliminated.

U.S. Pat. No. 5,260,225 to Liu et al. shows a method for fabricating an infrared bolometer. The method utilizes oxide and silicon nitride layers to provide a location for the active layer, an appropriately doped polysilicon layer.

SUMMARY OF THE INVENTION

Accordingly, it is a primary objective of the invention to provide a photosensitive device with minimal dark current and where the ratio of current in light to dark current increases with increasing bias. Thus even at low light intensities the photon-induced current can be made to exceed the dark current.

The objectives of the invention are achieved by using a tunnel diode, with a wide band gap insulator providing the tunneling barriers, as the photosensitive device. For an appropriately high and thick potential barrier, currents in the dark at moderate bias are very small. Incident light energizes tunneling electrons, essentially reducing the barrier energy and increasing the tunneling probability. The affect of the bias is more pronounced on this essentially reduced barrier. Thus, whereas in conventional photodiodes the electric field act on optically and thermally generated current carriers in the same way, for tunneling photodiodes the affect of the field is more pronounced on the optically energized carriers.

According to a preferred embodiment of the invention a tunneling photodiode is fabricated by forming a p-well in an n-type substrate, forming a thin insulating layer over the surface of the p-type material, and then forming a thin n-type layer over the insulating layer. Preferably, the n and p type semiconductor material could be silicon and the insulating layer could be between about 30 to 40 angstroms of gate quality silicon dioxide.

In other embodiments of the invention the materials on either side of the insulator could be either n or p-type semiconductors or metals. The insulating layer should exhibit very low leakage in the dark and be reliable even for the thin layers, usually less then 100 angstroms, required in this invention. Gate quality insulators generally meet these requirements.

BRIEF DESCRIPTION OF THE DRAWINGS

In the accompanying drawings, forming a material part of this description, there is shown:

FIG. 1 Prior Art shows a conventional junction photodiode.

FIG. 2 Prior Art presents a band diagram of a conventional junction photodiode.

DESCRIPTION OF THE PREFERRED EMBODIMENTS

Figure 3:
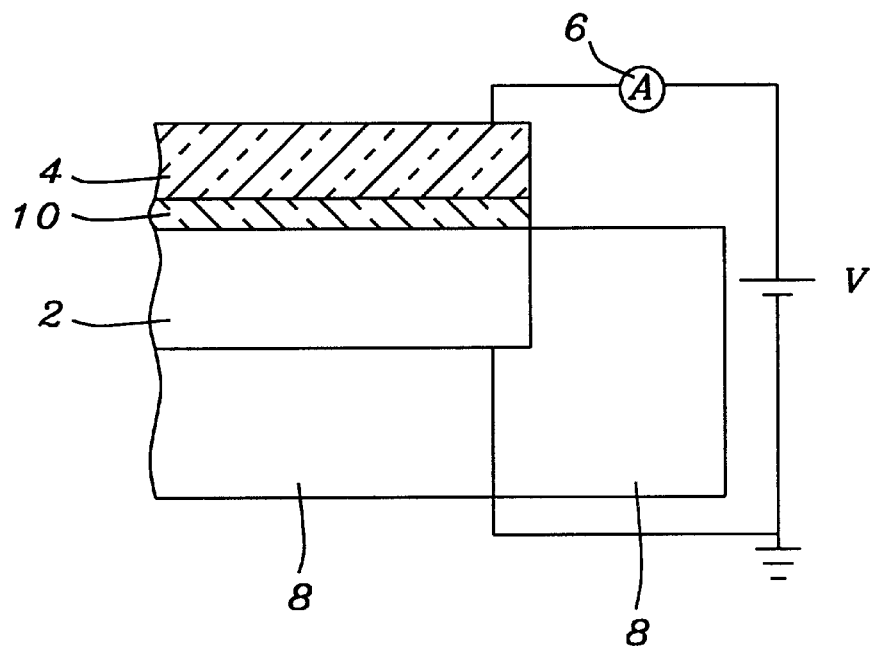
FIG. 3 shows a tunnel photodiode according to a preferred embodiment of the invention.

Referring to FIG. 3 there is shown the structure of a tunnel photodiode according to a preferred embodiment of the invention. As in a junction photodiode, a p-well, 2, is formed in an n-type substrate, 8, where preferably the semiconductor is silicon. A p-well is a preferred method to provide isolation from other devices in an n-substrate. Procedures for forming p-wells, and also n-wells, are well known to those versed in the art. A thin insulating layer, 10, preferably a layer of thermally grown silicon dioxide about 30 to 40 angstroms thick, is disposed over the surface of the p-well. An n-type polysilicon layer, 4, is then deposited over the silicon dioxide layer. The thickness of the polysilicon layer should not appreciably exceed the absorption length of the light within the wavelength range of interest. Techniques for forming the oxide and polysilicon layers are well known to those versed in the art.

Figure 4:
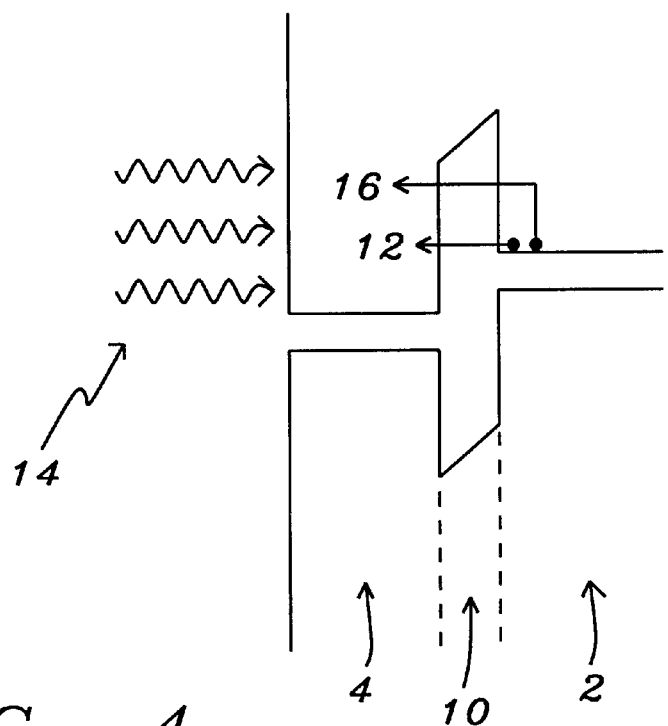
FIG. 4 presents a band diagram of a tunnel photodiode according to a preferred embodiment of the invention.
Figure 5:
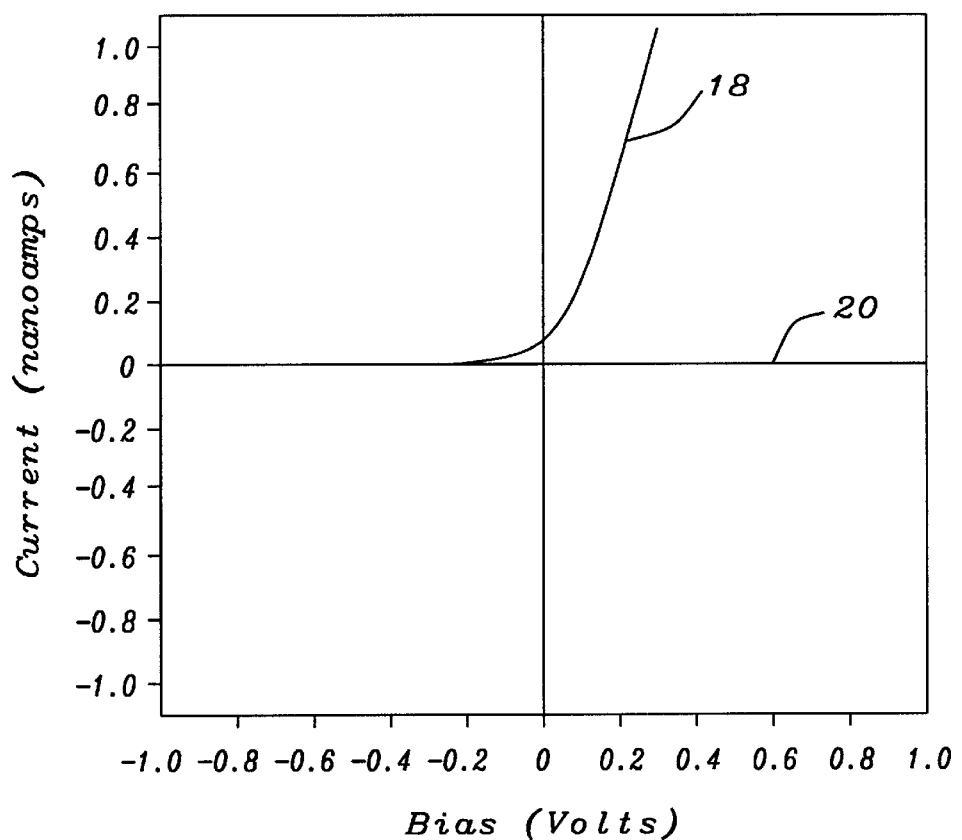
FIG. 5 is a graph of the current versus voltage, with and without light, measured on a tunnel photodiode fabricated according to a preferred embodiment of this invention.

A band diagram of a tunnel photodiode according to this embodiment is shown in FIG. 4. For reverse bias electrons tunnel predominately from the p-well, 2, toward the n-type polysilicon, 4. In the dark a typical tunneling path is the direct tunneling path 12, where an electron tunnels from the p-well conduction band to the conduction band of the polysilicon. When light is incident on the polysilicon surface, photons easily penetrate the polysilicon layer, which is thinner than an absorption length of the light, and even more easily penetrate the transparent thin oxide layer. Photons, 14, interacting with electrons of the p-well raise their energy and thus when these electrons tunnel the barrier heights are reduced by the energy gained, as indicated in electron path 16. As shown in FIG. 5, the current with light, 18, is by far more strongly increasing with bias than the dark current, 20. Therefor the current in light of a tunnel photodiode can always, by adjusting the bias, be made to dominate the dark current. The tunnel photodiode used has a 35-angstrom thick silicon dioxide layer thermally grown on a p-well and a thin n-type polysilicon layer deposited on the oxide. For the voltage range covered the dark current is negligibly small; whereas the current with light is already in the nanoampere range at low bias and increases exponentially with bias.

In other preferred embodiments of the invention the bottom electrode can be a p-type substrate or a p-type semiconductor deposited on an n or p-type semiconductor substrate or on an insulating substrate. Deposition and isolation techniques, if required, are well known to those versed in the art. If the bottom electrode is to be the injecting electrode, absorption lengths of materials used should be small enough so that light is absorbed strongly near the insulator interface resulting in large numbers of energized electrons that pass through the insulator with high probability; otherwise this is not desirable. The bottom electrode layer thickness range is not dictated by light detection requirements. It is important that the conductivity and thickness be large enough so that the electrode does not introduce significant resistance.

The insulating layer disposed over the bottom electrode can either be thermally grown or deposited. Wide bandgap insulators are to be used for the insulating layer since large barrier heights are required for low dark currents. A lower bound for the insulating layer thickness is imposed by reliability requirements. The insulator field at the applied bias during operation should not be so large that dielectric breakdown could occur, during the desired life of the devise, with an intolerable likelihood. For gate quality insulating films, such as thermal silicon oxide films and LPCVD silicon oxide, silicon nitride and oxynitride films, high reliability is achieved when the insulator field is less than about 5 E6 volts per centimeter. Thus, for example, with a bias of 1 volt and a built-in potential of 0.75 volts, the insulator film thickness should be greater than about 35 angstroms. Another criteria that gives rise to a lower bound is the requirement of low dark current, but the bound obtained in this way is usually lower than that obtained from the reliability criteria. An upper bound for the insulator layer thickness is imposed by detectability requirements. The thinner the insulating layer the lower is the light intensity of a given wavelength that can be detected at the applied bias and the longer the wavelength the lower is the signal. Therefore, the minimum signal required at the lowest light intensity desired to detect, at the longest wavelength of interest, can determine the largest acceptable insulating layer thickness.

The upper electrode, in the preferred embodiments, can be a deposited layer of n or p-type polysilicon or other semiconductor, or a deposited metal layer. Semiconductor materials that can be used include silicon, poly and amorphous-silicon, hydrogenated silicon, germanium, and gallium arsenide; metals such as gold, chromium, aluminum, tantalum, tungsten and platinum are also appropriate electrode materials. The thickness of this layer should not be greater than the absorption length of the light so that a significant number of electrons will be energized near the insulator interface to pass through the barrier. Barrier heights vary for different electrode materials on the same insulator. The larger the barrier height, the larger the bias or the thinner the insulator layer that is required for a given signal. Also the built-in potential is determined, to a large extent, by the barrier heights at both electrode-insulator interfaces. As with the bottom electrode, the conductivity and thickness should be large enough not to introduce significant resistance.

Other preferred embodiments utilize n-type semiconductors as bottom electrodes; either an n-well, a deposited layer or an n-type substrate. Metallic layers on semiconductor or insulator substrates are appropriate as bottom electrodes according to preferred embodiments of the invention. The insulator and top electrode layers in these preferred embodiments are as described for the preferred embodiments with a p-type semiconductor as the bottom electrode.

While the invention has been particularly shown and described with reference to the preferred embodiments thereof, it will be understood by those skilled in the art that various changes in form and detail may be made without departing from the spirit and scope of the invention.

What is claimed is:

1. A tunnel photodiode comprising:
   a substrate and a conducting layer on said substrate to be the bottom electrode;
   an insulating layer on the bottom electrode;
   a conducting layer over the insulating layer to be the top electrode.

2. The tunnel photodiode of claim 1 wherein said bottom electrode is a semiconductor or metal layer.

3. The tunnel photodiode of claim 1 wherein said insulating layer is a silicon oxide, silicon nitride or silicon oxynitride layer.

4. The tunnel photodiode of claim 1 wherein said top electrode is a semiconductor or metal layer.

* * * * *

UNITED STATES PATENT AND TRADEMARK OFFICE
CERTIFICATE OF CORRECTION

PATENT NO. : 6,693,317 B2
DATED : February 17, 2004
INVENTOR(S) : Ho-Yin Yiu et al.

It is certified that error appears in the above-identified patent and that said Letters Patent is hereby corrected as shown below:

<u>Title page,</u>
Item [75], Inventors, delete "Ho-Yin Yiu, Hong Kong (TW)" and replace with
-- Ho-Yin Yiu, Hong Kong, Hong Kong --.

Signed and Sealed this

Twenty-second Day of June, 2004

JON W. DUDAS
*Acting Director of the United States Patent and Trademark Office*